US008154761B2

(12) United States Patent
Huber et al.

(10) Patent No.: US 8,154,761 B2
(45) Date of Patent: Apr. 10, 2012

(54) METHOD FOR COLOR REGULATION OF REPRODUCTION COPIES OF A PRINTING PRESS

(75) Inventors: Werner Huber, Wiesloch (DE); Michael Kaiser, Heidelberg (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 1248 days.

(21) Appl. No.: 11/710,877

(22) Filed: Feb. 26, 2007

(65) Prior Publication Data

US 2007/0201065 A1 Aug. 30, 2007

(30) Foreign Application Priority Data

Feb. 24, 2006 (DE) ......................... 10 2006 008 692

(51) Int. Cl.

| | |
|---|---|
| ***G06F 15/00*** | (2006.01) |
| ***G03F 3/08*** | (2006.01) |
| ***B41F 31/00*** | (2006.01) |
| ***G06K 9/00*** | (2006.01) |
| ***B41J 2/00*** | (2006.01) |

(52) U.S. Cl. ......... 358/1.9; 358/518; 101/491; 382/167; 347/110

(58) Field of Classification Search ........................ None
See application file for complete search history.

(56) References Cited

U.S. PATENT DOCUMENTS

| | | | | |
|---|---|---|---|---|
| 6,290,318 | B1 * | 9/2001 | Yasukawa | 347/16 |
| 6,389,968 | B1 * | 5/2002 | Sugimoto et al. | 101/365 |
| 6,450,097 | B1 * | 9/2002 | Kistler et al. | 101/483 |
| 6,564,714 | B2 | 5/2003 | Brydges et al. | |
| 2003/0097947 | A1 * | 5/2003 | Caruthers et al. | 101/484 |
| 2005/0047654 | A1 * | 3/2005 | Newman et al. | 382/167 |
| 2005/0083540 | A1 * | 4/2005 | Hersch et al. | 358/1.9 |
| 2005/0146544 | A1 * | 7/2005 | Kondo | 347/7 |
| 2006/0082844 | A1 * | 4/2006 | White | 358/504 |
| 2006/0130687 | A1 * | 6/2006 | Weichmann | 101/365 |
| 2006/0170938 | A1 * | 8/2006 | Ibarluzea et al. | 358/1.9 |

FOREIGN PATENT DOCUMENTS

| | | | |
|---|---|---|---|
| CN | 1479675 | A | 3/2004 |
| DE | 102 18 277 | A1 | 11/2003 |

OTHER PUBLICATIONS

English translation of Chinese Office Action dated Nov. 6, 2009.

* cited by examiner

*Primary Examiner* — Twyler Haskins
*Assistant Examiner* — Barbara Reinier
(74) *Attorney, Agent, or Firm* — Laurence A. Greenberg; Werner H. Stemer; Ralph E. Locher

(57) ABSTRACT

A method for color regulation of reproduction copies of a printing press prints a substrate, which appears dark in a standardized color measurement, with at least one printing ink which is lighter than the substrate. At least one color value of the printing ink is determined from a measured variable, and the color value of the at least one printing ink is regulated with the aid of a fixed reference value of a color locus in the color space which is lighter than the printing ink.

14 Claims, 2 Drawing Sheets

METHOD FOR COLOR REGULATION OF REPRODUCTION COPIES OF A PRINTING PRESS

CROSS-REFERENCE TO RELATED APPLICATION

This application claims the priority, under 35 U.S.C. §119, of German application DE 10 2006 008 692.9, filed Feb. 24, 2006; the prior application is herewith incorporated by reference in its entirety.

BACKGROUND OF THE INVENTION

Field of the Invention

The invention relates to a method for color regulation of reproduction copies of a printing press, in which a substrate which appears dark in a standardized color measurement is printed with at least one printing ink which is lighter than the substrate, and at least one color value of the printing ink is determined from a measured variable.

For the calculation and the regulation of a layer thickness of printing inks on the basis of spectral color measurements, in particular of color measuring strips, it is a precondition that the substrate (also called printing material) is lighter than the color which is to be printed. In particular, it is likewise a precondition that the printing ink appears darker as the layer thickness increases, and that the printing ink is glossy. This is the case for offset printing inks. In this context, the regulating devices which are marketed by the company Heidelberger Druckmaschinen AG under the names IMAGE CONTROL® and/or AXIS CONTROL® for printing presses, in particular offset printing presses, are known, for example, to a person skilled in the art. Features of these products which are available to the public are combined with the disclosure of this summary by a person skilled in the art, without thereby being inventive.

The layer thickness is usually determined on the basis of a measured brightness difference between the substrate and the applied printing ink. In this way, regulation of a light printing ink on a dark substrate, for example recycled paper or metal (such as, for example, for offset printing on metal as disclosed in published, non-prosecuted German patent application DE 102 18 277 A1), is not possible, however, as the ink which is to be printed appears lighter. This fact is a particular problem for transparent or metalized substrates which appear black to a measuring instrument under standard conditions (0 or 45° angular measurement) on account of their reflection properties.

In practice, the difficulty described can be bypassed by color measuring strips being backed with a white pigment, with the result that measurement and regulation of the printing inks are made possible in the color measuring strip. However, it is necessary for correct measurement and regulation of the printing inks that the white pigment is applied very uniformly. The backing takes place manually. Here, deviations which bring about measuring errors for the measured layer thicknesses are produced from measuring strip to measuring strip, in particular from inking zone to inking zone of a zonal printing press. It is not possible to regulate the layer thickness of the (applied) white pigment itself, as its background, the substrate, appears black.

As an alternative to this, a grid field, for example 70%, can be provided in practice with white pigment in a color measuring strip. During the measuring operation, the white pigment and the substrate are exchanged, and the grid field is observed as if the white pigment were the background and the substrate were the printing ink. This means that the tonal value of the black grid field, for example 30% here, is measured on a white printing material. Although a plurality of inking zones of a zonal printing press are compared relative to one another in this way and variations during operation are detected, the white pigment per se has to be measured in an additional operation, in particular by an external measuring instrument and not during operation.

In the case of a transparent substrate, it is also possible to place a white strip of paper, plastic or the like behind it. This aid is not possible, however, in the case of substrates which are not transparent.

SUMMARY OF THE INVENTION

It is accordingly an object of the invention to provide a method for color regulation of reproduction copies of a printing press which overcomes the above-mentioned disadvantages of the prior art methods of this general type.

With the foregoing and other objects in view there is provided, in accordance with the invention, a method for color regulation of reproduction copies of a printing press. The method includes printing a substrate, which appears dark in a standardized color measurement, with at least one printing ink which is lighter than the substrate; and determining at least one color value of the printing ink from a measured variable. The color value of the at least one printing ink is regulated with the aid of a fixed reference value of a color locus in a color space being lighter than the printing ink.

It is an object of the invention to make color regulation possible for the reproduction copies on a substrate which appears dark in a standardized color measurement, in particular by the measurement of the layer thickness.

In the method according to the invention for color regulation, in particular spectral color regulation, of reproduction copies of a printing press, in particular for multiple-color printing, a substrate which appears dark, in particular black, in a standardized color measurement is printed with at least one printing ink which is lighter than the substrate, at least one color value of the printing ink (on one copy of the reproduction copies) is determined from a measured variable, in particular the remanence or the layer thickness of the printing ink. The color value of the at least one printing ink is regulated with the aid of a fixed reference value, in particular with respect to a fixed reference value, of a color locus in the color space which is lighter than the printing ink. In other words, the printing ink has a second brightness which is greater than the first brightness of the substrate but is smaller than the third brightness of the color locus in the color space.

The reference value can also be called a virtual reference value, in order to make it clear that it is a mathematically determined or calculated or predefined value and not a measured value during the printing operation which is to be regulated. However, the reference value can also be a measured value from another context or from a sample (for example, a printing original). The printing ink which is used in the method according to the invention can be glossy. A manipulated variable for the ink amount of the printing ink to be printed can be set or adjusted by a suitable amount as a function of the qualitative result of the comparison of the color value (actual value) with a setpoint value, here, in particular, the reference value according to the invention, with the result that the actual value can be affected in the following individual copies of the reproduction copies. The regulating goal can be the minimization of a difference or of the color distance between the color value and the reference value. In other words, the layer thickness of the printing ink on the substrate can be regulated. A standardized color measurement preferably takes place in measuring conditions of a 0 degrees and/or 45 degrees measuring angle. The color measurement can also be called, in particular, spectral color measurement. In conjunction with this summary, the color value can also be understood as a group of a plurality of numbers, in particular the coordinates in a color space, or one coordinate in the color space. In particular, the color value can be a measure of the brightness of the printing ink. The color space on which this is based can be a color space which is dependent on the instrument or a color space which is independent of the instrument, preferably, in particular, the XYZ space or the Lab space.

The method according to the invention can be used in the same way advantageously for a multiplicity of substrates which appear dark, in particular black, in a standardized color measurement, and therefore represents simple and user-friendly regulation.

Furthermore, on the basis of the method according to the invention, customary color regulation on the basis of layer thicknesses can advantageously be used, and only relative regulation with respect to a reference point instead of with respect to the substrate takes place. The control or regulation algorithms on which this is based for actuating the actuators of the printing press do not need to be changed, in order for it to be possible to use the method according to the invention.

Moreover, if the method according to the invention is used, both the printing ink which is lighter than the substrate and other printing inks can advantageously be detected with the same measuring operation. Simultaneous regulation can advantageously take place. In particular, in certain embodiments, the other printing inks can be darker than the substrates.

Individual method steps of methods for color regulation, in particular with regard to the concrete measuring operation and/or the actuators which are to be actuated, are known to a relevant person skilled in the art. For example, a relevant person skilled in the art turns to the textbook "Handbuch der Printmedien" [Handbook of Print Media] by Helmut Kipphan, Springer Verlag, Berlin, Heidelberg, N.Y., 2000, in the German or English edition. The disclosure of this work is herewith incorporated by reference herein in its entirety.

In the method according to the invention for color regulation, the reference value is preferably fixed or set without measurements and/or independently of the printing operation which is to be regulated. If the method according to the invention is realized in a computer program (a control or regulating program of the printing press), the reference value can be programmed in a fixed manner or can be input, selected, specified and/or changed by the operator in a variable manner. In particular, the reference value can be used for various individual reproduction jobs and not be related to only to the specific job which is currently being regulated.

In one preferred embodiment, the at least one printing ink is a white pigment. According to the invention, the printing ink, in particular white pigment, can be treated with particular advantage as a spot color, that is to say a color in addition to the customary colors for representing the color space, for example in addition to the colors cyan (C), magenta (M), yellow (Y) and black (K), and can be regulated relative to a reference point in the color space.

In one preferred embodiment, the reference value is absolute white having the color coordinates L=100, a=0, b=0 (preferred) or x=y=z=100. As an alternative to this, a color having a color locus between absolute white and the at least one printing ink can be the reference value.

It is particularly advantageous if the color distance of the color value of the printing ink and the reference value is selected to be extremely great (as great as possible), with the result that there is a high contrast and, in particular, even small layer thicknesses of the printing ink have a considerable brightness difference with respect to the reference value. As is known to a relevant person skilled in the art, a standard which describes the distance of points in the color space can be defined on a color space which forms the basis. As an alternative to this, the color distance can also be a simple value difference (coordinate difference).

In one advantageous development of the invention, the color value of at least one other printing ink can be regulated with the aid of another reference value, in particular with respect to another reference value. In other words, the method according to the invention can be applied to a multiplicity of printing inks. In this way, relative regulation can be carried out in a direct relationship with different reference values.

In a further advantageous development of the method, the color value of at least one other printing ink can be regulated with the aid of a color value, in particular with respect to the color value, of the printing ink. In this way, relative regulation can be carried out in an indirect relationship with the reference value.

The substrate can be transparent or reflective. Furthermore or as an alternative to this, the substrate can be recycled paper or film material or a metallic carrier (also a metallic layer or coating which acts as a carrier for printing ink).

In one concrete embodiment, a color measuring strip of other printing inks is printed, which color measuring strip is backed with the printing ink. Furthermore or as an alternative to this, a (further or the same) color measuring strip of other printing inks can be printed, which color measuring strip has at least one gap between color areas of other printing inks, which gap is filled with the printing ink.

It is preferred if the printing takes place in an offset printing process, in particular a wet offset printing process. In other words, the printing press is preferably an offset printing press, in particular a wet offset printing press.

Customary printing presses, in particular offset printing presses (having a zonal inking unit), have a division into individual zones, in which in each case one ink supply can take place in different amounts. According to the method according to the invention, the ink regulation can take place in each case in individual zones of the reproduction copy, independently of one another. The method can be used in each individual zone. Very small deviations can be measured zone by zone advantageously and can be considered for the zonal calculation of the printing inks, in particular the ink layer thicknesses.

A regulating device for a printing press, in particular for multiple-color printing, is associated with the inventive concept. The principles and possible embodiments of regulating devices of this type are known to a person skilled in the art. For example, the company Heidelberger Druckmaschinen AG markets regulating devices for printing presses under the names IMAGE CONTROL® and/or AXIS CONTROL®. The regulating device according to the invention has a storage unit, in which a computer program is located for carrying out the method for ink regulation on the printing press, having features or combinations of features according to this summary. A printing press according to the invention, in particular an offset printing press, has at least one regulating device according to the invention. The printing press can be a printing press which processes sheets or a web. In particular, a sheet can be printed as a reproduction copy. A printing press which processes sheets can have a feeder, a number of printing units (typically four, five, six, eight, ten or twelve printing units) and a deliverer. The printing press which processes sheets can also have a sheet turning device and/or a dryer and/or a finishing unit (a varnishing unit, a punching unit or a cutting unit).

Other features which are considered as characteristic for the invention are set forth in the appended claims.

Although the invention is illustrated and described herein as embodied in a method for color regulation of reproduction copies of a printing press, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
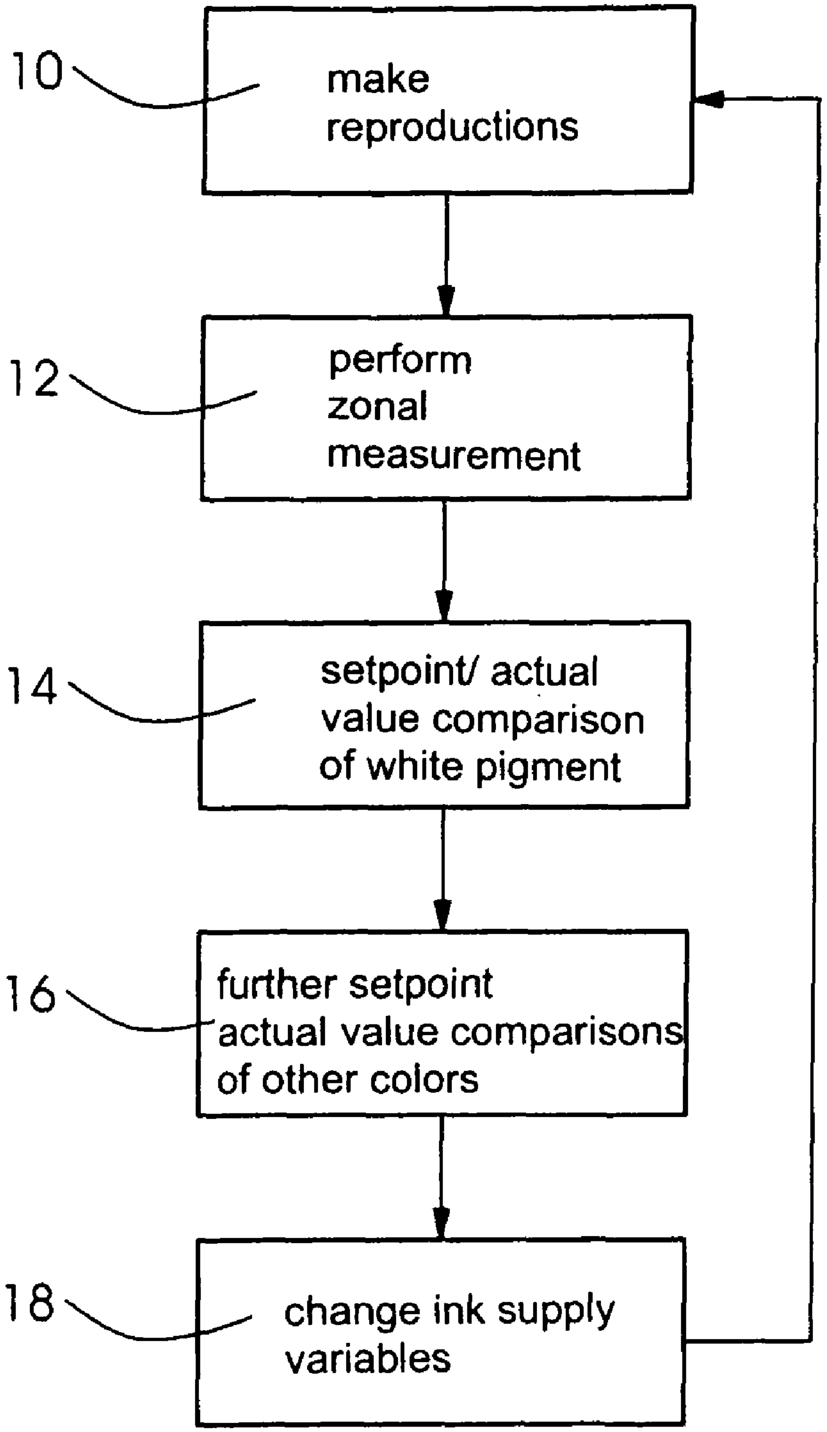
FIG. 1 is a flow chart of one preferred embodiment of the method according to the invention.

Referring now to the figures of the drawing in detail and first, particularly, to FIG. 1 thereof, there is shown diagrammatically a flow chart of one preferred embodiment of the method according to the invention. In this preferred embodiment, reproductions 10 of a multiple-color print subject are made in an offset printing press on sheets of paper or cardboard being a substrate. The printing operation is controlled and/or regulated, and the ink and/or dampening solution supply is controlled and/or regulated, in particular. Individual zones which are disposed in the lateral direction in relation to the sheet transport direction through the offset printing press are provided for the ink application. A color measuring strip is likewise printed together with the print subject for each inking zone. First, four standard colors (cyan, magenta, yellow and black), and other printing inks, are applied in order to represent the color space, and second a white pigment is also printed. The substrate appears darker than the white pigment. According to the invention, the white pigment and printing inks are set up simultaneously in the offset printing press. The white pigment is treated in the same way as a customary spot color in addition to the standard colors. According to the invention, a zonal measurement 12 takes place of the white pigment and the other printing inks. In other words, the printing inks and the white pigment of each color measuring strip of an inking zone are measured. Subsequently, a setpoint/actual value comparison 14 of the printed white pigment is carried out in the regulating device of the offset printing press for each inking zone, with consideration of a reference value or in relation to a reference value which is lighter than the white pigment. In other words, the reference value represents a calculated or virtual substrate for the regulation according to the invention. In the regulation, the white pigment is considered to be a spot color, a printing ink which is printed additionally alongside the standard colors. Absolute white is defined as a reference point for the white pigment. Furthermore, setpoint/actual value comparisons 16 are also carried out for the other printing inks in the regulating device of the offset printing press. These comparisons consider or relate to the printed white pigment to the extent that the latter represents the background white or reference white in the function of a substrate. In particular, the brightness differences with respect to the white pigment are determined for the other printing inks, with the result that conclusions can be drawn about the respective layer thickness. In other words, the measured value for the white pigment from the same inking zone is used as a reference point for the actual printing inks. In the case of one or more deviations which are possibly determined from the target value or the target values, a change 18 in the manipulated variables which act on the ink supply is performed, with the result that further reproductions can be carried out with new adapted parameters.

Figure 2:
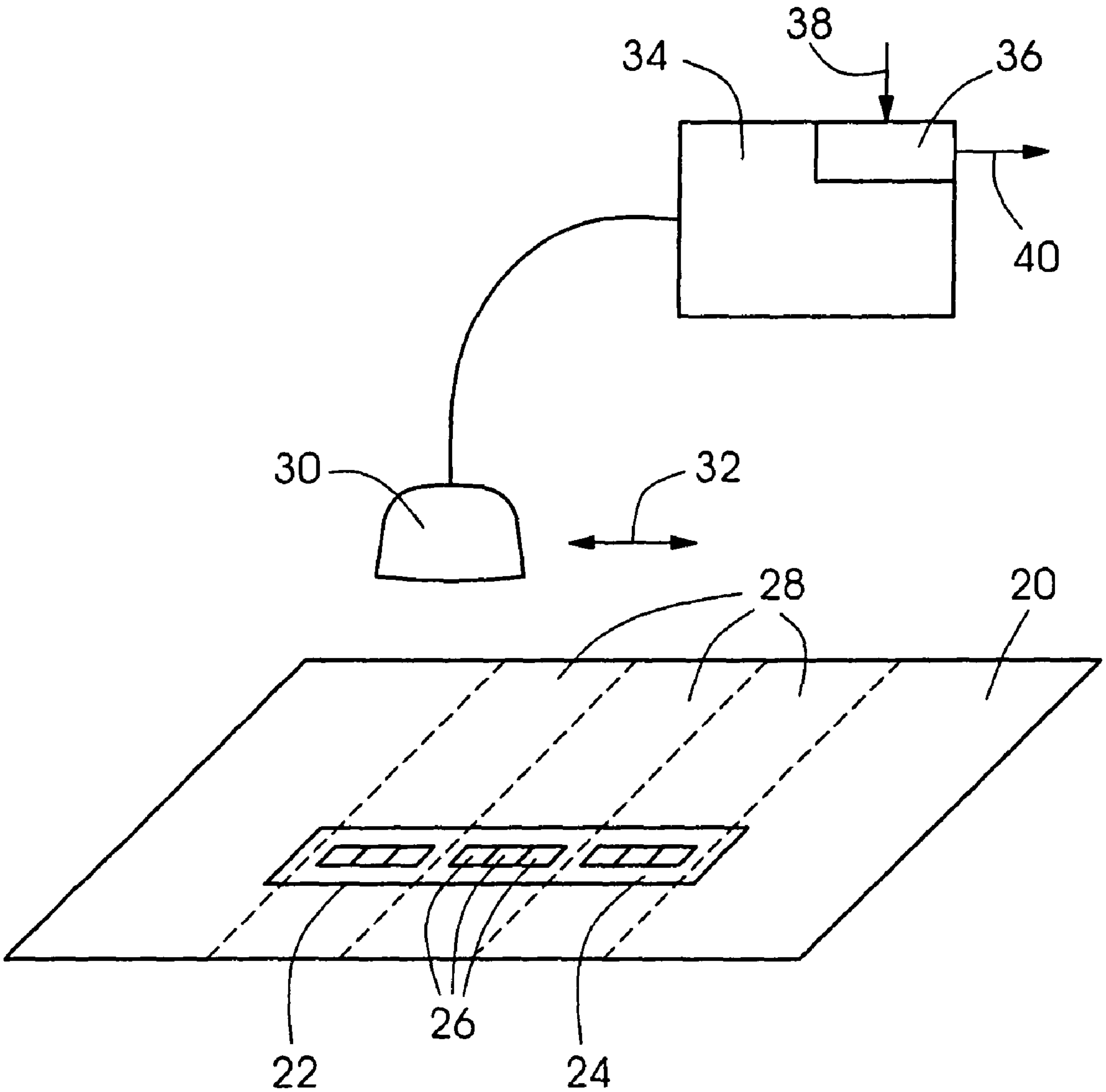
FIG. 2 is a diagrammatic illustration of an embodiment of a configuration for color measurement according to the invention.

FIG. 2 is a diagrammatic illustration of one embodiment of a configuration according to the invention for color measurement. One sample of the print subject which is reproduced in an offset printing press on a substrate 20 has a color measuring strip 22. The color measuring strip 22 is backed with a white pigment 24. The color measuring strip 22 has gaps for measuring the white pigment and contains measurement fields 26 of the other printing inks, in particular the standard printing inks, in each inking zone 28. The white pigment and the other printing inks can therefore be measured and regulated in one measuring operation. A measuring instrument 30 performs a relative movement 32 in relation to the substrate 20, with the result that the measurement fields 26 and the white pigment 24 in the color measuring strip 22 in the individual inking zones 28 can be detected for a regulating device 34. The regulating device 34 executes the method steps, as described using FIG. 1. A measured point or an external sample is defined as the reference, as a setpoint value for the regulation of the white pigment. This setpoint value is selected in such a way that the coverage of the white pigment is sufficient and has as low a layer thickness as possible. The setpoint value or reference value is fed as a setting 38 to a storage unit 36 of the regulating device 34. A signal output 40 takes place for the actuators of the offset printing press.

We claim:

1. A method for color regulation of reproduction copies of a printing press, which comprises the steps of:

printing a substrate, which appears dark in a standardized color measurement, with at least one printing ink which is lighter than the substrate;

determining at least one color value of the printing ink from a measured variable;

regulating the ink layer thickness of the at least one printing ink in the printing press with an aid of a fixed reference value of a color locus in a color space being lighter than the printing ink; and printing a color measuring strip of other printing inks, the color measuring strip being backed with the printing ink.

2. The method for color regulation according to claim 1, which further comprises setting the fixed reference value without measurements and/or independently of a printing operation which is to be regulated.

3. The method for color regulation according to claim 1, which further comprises providing a white pigment as the at least one printing ink.

4. The method for color regulation according to claim 1, which further comprises providing the fixed reference value as absolute white having color coordinates x=y=z=100 or a color having a color locus between absolute white and the at least one printing ink.

5. The method for color regulation according to claim 1, which further comprises selecting a color distance of the color value of the printing ink and the fixed reference value to be as great as possible.

6. The method for color regulation according to claim 1, which further comprises regulating a further color value of at least one other printing ink with an aid of another reference value.

7. The method for color regulation according to claim 6, which further comprises regulating the further color value of the at least one other printing ink with the color value of the printing ink.

8. The method for color regulation according to claim 1, which further comprises providing the substrate to be one of transparent and reflective.

9. The method for color regulation according to claim 1, which further comprises forming the substrate from recycled paper, a film material, or as a metallic carrier.

10. A method for color regulation of reproduction copies of a printing press, which comprises the steps of:

printing a substrate, which appears dark in a standardized color measurement, with at least one printing ink which is lighter than the substrate;

determining at least one color value of the printing ink from a measured variable;

regulating the ink layer thickness of the at least one printing ink in the printing press with an aid of a fixed reference value of a color locus in a color space being lighter than the printing ink; and printing a color measuring strip of other printing inks, the color measuring strip has at least one gap between color areas of other printing inks, the gap being filled with the printing ink.

11. The method for color regulation according to claim 10, which further comprises performing the printing in an offset printing process.

12. The method for color regulation according to claim 1, which further comprises performing the color regulation to take place in each case in individual zones of one of the reproduction copies, independently of one another.

13. A regulating device for a printing press, the regulating device comprising:

a memory unit having a computer program containing computer executable instructions, loaded into a processor, for carrying out the steps of:

printing a substrate, which appears dark in a standardized color measurement, with at least one printing ink which is lighter than the substrate;

determining at least one color value of the printing ink from a measured variable;

regulating the ink layer thickness of the at least one printing ink in the printing press with an aid of a fixed reference value of a color locus in a color space being lighter than the printing ink; and printing a color measuring strip of other printing inks, the color measuring strip being backed with the printing ink.

14. A printing press, comprising:

a regulating device containing a memory unit having a computer program containing computer executable instructions, loaded into a processor, for carrying out the steps of:

printing a substrate, which appears dark in a standardized color measurement, with at least one printing ink which is lighter than the substrate;

determining at least one color value of the printing ink from a measured variable;

regulating the ink layer thickness of the at least one printing ink in the printing press with an aid of a fixed reference value of a color locus in a color space being lighter than the printing ink; and printing a color measuring strip of other printing inks, the color measuring strip being backed with the printing ink.

* * * * *